(12) United States Patent
Haringer et al.

(10) Patent No.: US 10,889,913 B2
(45) Date of Patent: Jan. 12, 2021

(54) GAS DOPING SYSTEMS FOR CONTROLLED DOPING OF A MELT OF SEMICONDUCTOR OR SOLAR-GRADE MATERIAL

(71) Applicant: MEMC Electronic Materials S.p.A., Novara (IT)

(72) Inventors: Stephan Haringer, Ciardes (IT); Roberto Scala, Merano (IT); Marco D'Angella, Merano (IT)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/228,235

(22) Filed: Dec. 20, 2018

(65) Prior Publication Data
US 2019/0119827 A1 Apr. 25, 2019

Related U.S. Application Data

(62) Division of application No. 14/774,310, filed as application No. PCT/IT2013/000077 on Mar. 15, 2013, now abandoned.

(51) Int. Cl.
C30B 15/04 (2006.01)
C30B 29/06 (2006.01)
C30B 15/10 (2006.01)

(52) U.S. Cl.
CPC .............. C30B 15/04 (2013.01); C30B 15/10 (2013.01); C30B 29/06 (2013.01)

(58) Field of Classification Search
CPC .......... C30B 15/04; C30B 15/10; C30B 29/06
See application file for complete search history.

(56) References Cited

U.S. PATENT DOCUMENTS 6,312,517 B1 11/2001 Banan et al.
2009/0314996 A1 12/2009 Kawazoe et al.
(Continued)

FOREIGN PATENT DOCUMENTS

JP H03271188 A 12/1991
JP 2001342094 A 12/2001
(Continued)

OTHER PUBLICATIONS

International Search Report and Written Opinion of the International Searching Authority regarding PCT/IT2013/000077 dated Nov. 26, 2013; 14 pgs.

*Primary Examiner* — Hua Qi
(74) *Attorney, Agent, or Firm* — Armstrong Teasdale LLP

(57) ABSTRACT

A crystal pulling apparatus for producing an ingot is provided. The apparatus includes a furnace and a gas doping system. The furnace includes a crucible for holding a melt. The gas doping system includes a feeding tube, an evaporation receptacle, and a fluid flow restrictor. The feeding tube is positioned within the furnace, and includes at least one feeding tube sidewall, a first end through which a solid dopant is introduced into the feeding tube, and an opening opposite the first end through which a gaseous dopant is introduced into the furnace. The evaporation receptacle is configured to vaporize the dopant therein, and is disposed near the opening of the feeding tube. The fluid flow restrictor is configured to permit the passage of solid dopant therethrough and restrict the flow of gaseous dopant therethrough, and is disposed within the feeding tube between the first end and the evaporation receptacle.

15 Claims, 3 Drawing Sheets

(56) References Cited

U.S. PATENT DOCUMENTS

2010/0175612 A1\* 7/2010 Narushima ............. C30B 15/04
    117/19
2010/0294999 A1\* 11/2010 Narushima ............. C30B 15/04
    252/512
2012/0056135 A1\* 3/2012 DeLuca ................. C30B 15/04
    252/512
2014/0033968 A1 2/2014 Giannattasio et al.

FOREIGN PATENT DOCUMENTS

| JP | 2010064930 A | | 3/2010 |
|---|---|---|---|
| JP | 2010143776 A | | 7/2010 |
| JP | 2010143776 A1 | \* | 7/2010 |
| JP | 4530483 B2 | | 8/2010 |
| JP | 2011132043 A | | 7/2011 |
| JP | 2012066965 A | \* | 4/2012 |
| JP | 2012066965 A | | 4/2012 |
| JP | 2013129551 A | | 7/2013 |
| WO | 0186033 A1 | | 11/2001 |

\* cited by examiner

GAS DOPING SYSTEMS FOR CONTROLLED DOPING OF A MELT OF SEMICONDUCTOR OR SOLAR-GRADE MATERIAL

CROSS-REFERENCE TO RELATED APPLICATIONS

This application is a divisional of U.S. application Ser. No. 14/774,310 filed on Sep. 10, 2015, which was the national stage entry under 35 U.S.C. § 371 of PCT/IT2013/000077 filed on Mar. 15, 2013, both of which are incorporated by reference in their entirety.

FIELD

The field relates generally to preparation of single crystals of semiconductor or solar-grade material and, more specifically, to a gas doping system for controlled doping of a melt of semiconductor or solar-grade material.

BACKGROUND

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon, and a single crystal is grown by slow extraction.

A certain amount of dopant is added to the melt to achieve a desired resistivity in the silicon crystal. Conventionally, dopant is fed into the melt from a feed hopper located a few feet above the silicon melt level. However, this approach is not favorable for volatile dopants because such dopants tend to vaporize uncontrolled into the surrounding environment, resulting in the generation of oxide particles (i.e., sub-oxides) that can fall into the melt and become incorporated into the growing crystal. These particles can act as heterogeneous nucleation sites, and ultimately result in failure of the crystal pulling process.

Further, in conventional systems, the sublimation of dopant granules at the melt surface often causes a local temperature reduction of the surrounding silicon melt, which in turn results in the formation of "silicon boats" adjacent the dopant granules. These silicon boats, along with the surface tension of the melt, prevent many of the dopant granules that do reach the melt surface from sinking into the melt, thus increasing the time during which sublimation to the atmosphere can occur. This phenomenon results in a significant loss of dopant to the gaseous environment and further increases the concentration of contaminant particles in the growth chamber.

Some known dopant systems introduce volatile dopants into the growth chamber as a gas. However, such systems must be manually refilled each time a doping procedure is performed. Additionally, such systems cannot be refilled while in use. As a result, such systems have a limited dopant payload capacity for a single growth process. Such systems) therefore limit the size of silicon ingots that can be grown. Furthermore, such systems tend to supply dopant non-uniformly during a growth process, thereby increasing the variation in dopant concentration along a grown ingot's longitudinal axis.

In other doping systems, inert gas is used to feed volatile dopants into a growth chamber. However, the use of inert gas tends to dilute the gaseous dopant, thereby decreasing the dopant concentration, and purge the evaporated dopant from the growth chamber too quickly. For example, dopants with low segregation coefficients such as arsenic (0.3) and phosphorus (0.35) require dopant concentrations in the melt of about 3 times higher than the desired dopant concentration in the grown crystal to compensate. As a result, the evaporated dopant does not have sufficient time to diffuse into the silicon melt, and more) dopant is needed to achieve a desired dopant concentration in the silicon melt.

Accordingly, a need exists for a simple, cost-effective approach to produce low resistivity, doped single crystal silicon by the Czochralski method.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a crystal pulling apparatus for producing a semiconductor or solar-grade ingot is provided. The apparatus includes a furnace and a gas doping system. The furnace includes a crucible for holding a melt of semiconductor or solar-grade material. The gas doping system includes a feeding tube, an evaporation receptacle, and a fluid flow restrictor. The feeding tube is positioned within the furnace, and includes at least one feeding tube sidewall, a first end through which a solid dopant is introduced into the feeding tube, and an opening opposite the first end through which a gaseous dopant is introduced into the furnace. The evaporation receptacle is configured to vaporize the dopant therein, and is disposed near the opening of the feeding tube. The fluid flow restrictor is configured to permit the passage of solid dopant therethrough and restrict the flow of gaseous dopant therethrough, and is disposed within the feeding tube between the first end and the evaporation receptacle.

In another aspect, a crystal pulling apparatus for producing a semiconductor or solar-grade ingot is provided. The apparatus includes a furnace and a gas doping system. The furnace includes a crucible for holding a melt of semiconductor or solar-grade material. The gas doping system includes a feeding tube, an evaporation receptacle, and a fluid flow channel. The feeding tube is positioned within the furnace, and includes at least one feeding tube sidewall, a first end through which a solid dopant is introduced into the feeding tube, and an opening opposite the first end through which a gaseous dopant is introduced into the furnace. The evaporation receptacle is configured to vaporize the dopant therein, and is disposed near the opening of the feeding tube. The evaporation receptacle includes a base extending inwardly from a feeding tube sidewall, and a receptacle sidewall adjoining the base and extending upwardly from the base. The fluid flow channel is at least partially defined by the receptacle sidewall and a feeding tube sidewall.

BRIEF DESCRIPTION OF THE DRAWINGS

Like reference symbols used in the various drawings indicate like elements.

DETAILED DESCRIPTION

Figure 1:
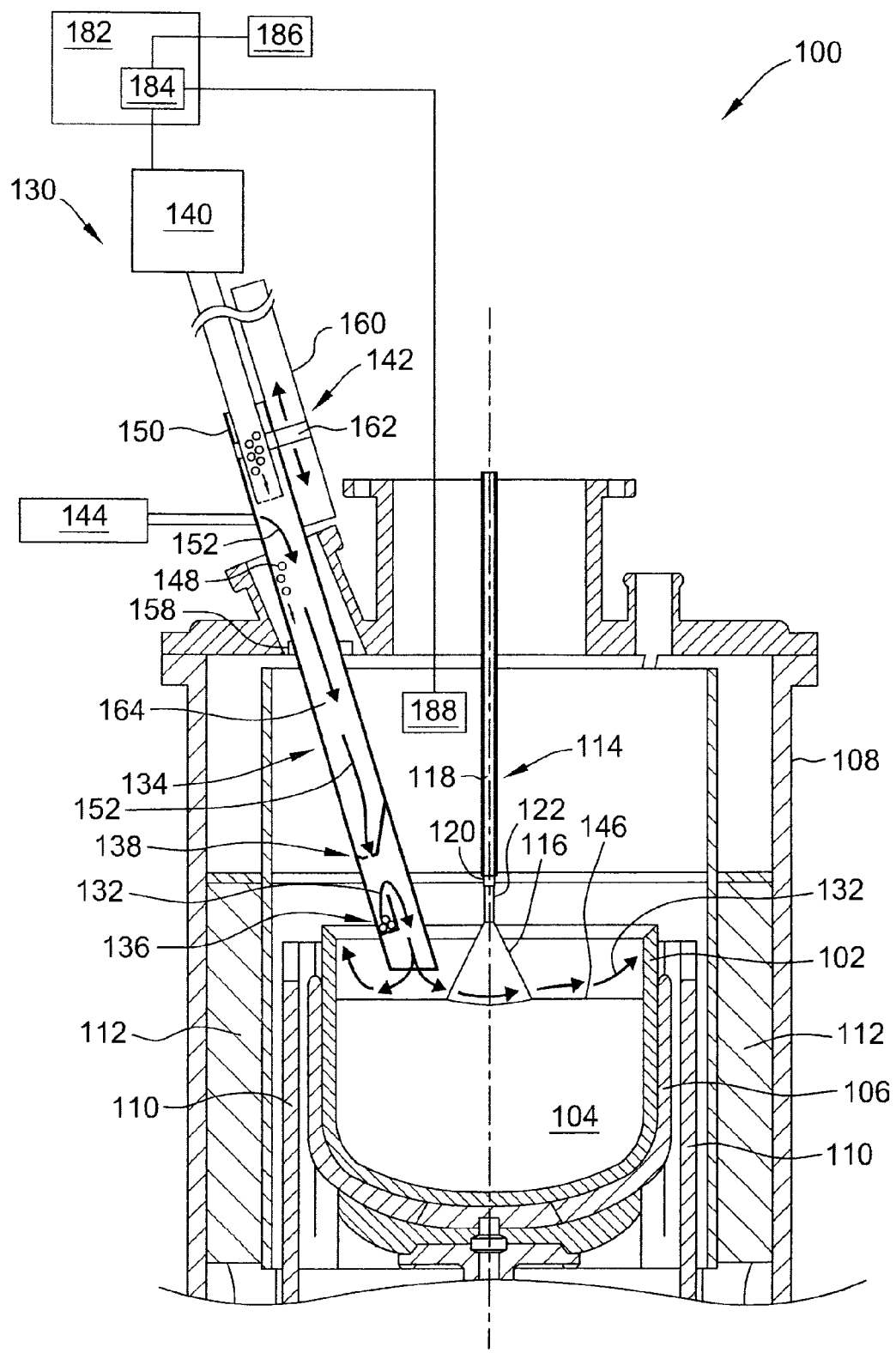
FIG. 1 is cross-section of a crystal pulling apparatus including a gas doping system.

A crystal pulling apparatus is indicated generally at 100 in FIG. 1. The crystal pulling apparatus 100 generally includes a crucible 102 for holding a melt 104 of semiconductor or solar-grade material, such as silicon, surrounded by a susceptor 106 contained within a furnace 108. The semiconductor or solar-grade material is melted by heat provided from one or more heating elements 110 surrounded by insulation 112.

A pulling mechanism 114 is provided within crystal pulling apparatus 100 for growing and pulling ingots 116 out of the melt 104. Pulling mechanism 114 includes a pulling cable 118, a seed holder or chuck 120 coupled to one end of pulling cable 118, and a seed crystal 122 coupled to the seed holder or chuck 120 for initiating crystal growth.

The crystal pulling apparatus 100 also includes a doping system (indicated generally at 130) for introducing gaseous dopant 132 into the melt 104. The doping system 130 includes a feeding tube 134, an evaporation receptacle 136, and a fluid flow restrictor 138. In this embodiment, the gas doping system 130 also includes a dopant feeding device 140, a positioning system 142, and an inert gas supply 144. Generally, the gas doping system is configured to cause gaseous dopant 132 to flow across a melt surface 146. Gaseous dopant 132 may be introduced into furnace 108 before crystal growth commences and/or during crystal growth, as shown in FIG. 1.

In operation, a solid volatile dopant 148, such as arsenic, phosphorous, or any other element or compound with a suitably low sublimation or evaporation temperature that enables the gas doping system to function as described herein, is introduced into feeding tube 134 through a first end 150 of feeding tube 134. Solid dopant 148 falls downwardly through feeding tube 134, and passes through fluid flow restrictor 138, and into evaporation receptacle 136. Heat supplied to evaporation receptacle 136 causes solid dopant 148 to vaporize into gaseous dopant 132. As gaseous dopant 132 expands, fluid flow restrictor 138 prevents gaseous dopant 132 from flowing back through fluid flow restrictor 138 and into cooler parts of feeding tube 134 ("back flow"). An inert gas 152, supplied by inert gas supply 144, may be flowed through feeding tube 134 and through fluid flow restrictor 138 to further restrict back flow of gaseous dopant 132. As gaseous dopant 132 vaporizes, it flows out of feeding tube 134 and across melt surface 146. As solid dopant 148 is consumed by vaporization, more solid dopant 148 may be fed into evaporation receptacle 136 by feeding device 140. By continuously or intermittently supplying solid dopant 148 to evaporation receptacle 136, a relatively constant gaseous dopant 132 concentration can be maintained above the melt surface 146 during the doping process and the crystal growth process. Furthermore, compared to similar dopant feeding systems, fluid flow restrictor 138 reduces the amount of inert gas flow needed to prevent back flow of gaseous dopant, and/or to supply gaseous dopant to the melt surface. As a result, the negative effects associated with the use of inert gas flow in gas doping systems, e.g., dilution of gaseous dopant concentration and gaseous dopant being purged too rapidly from the furnace, are also reduced.

Figure 2:
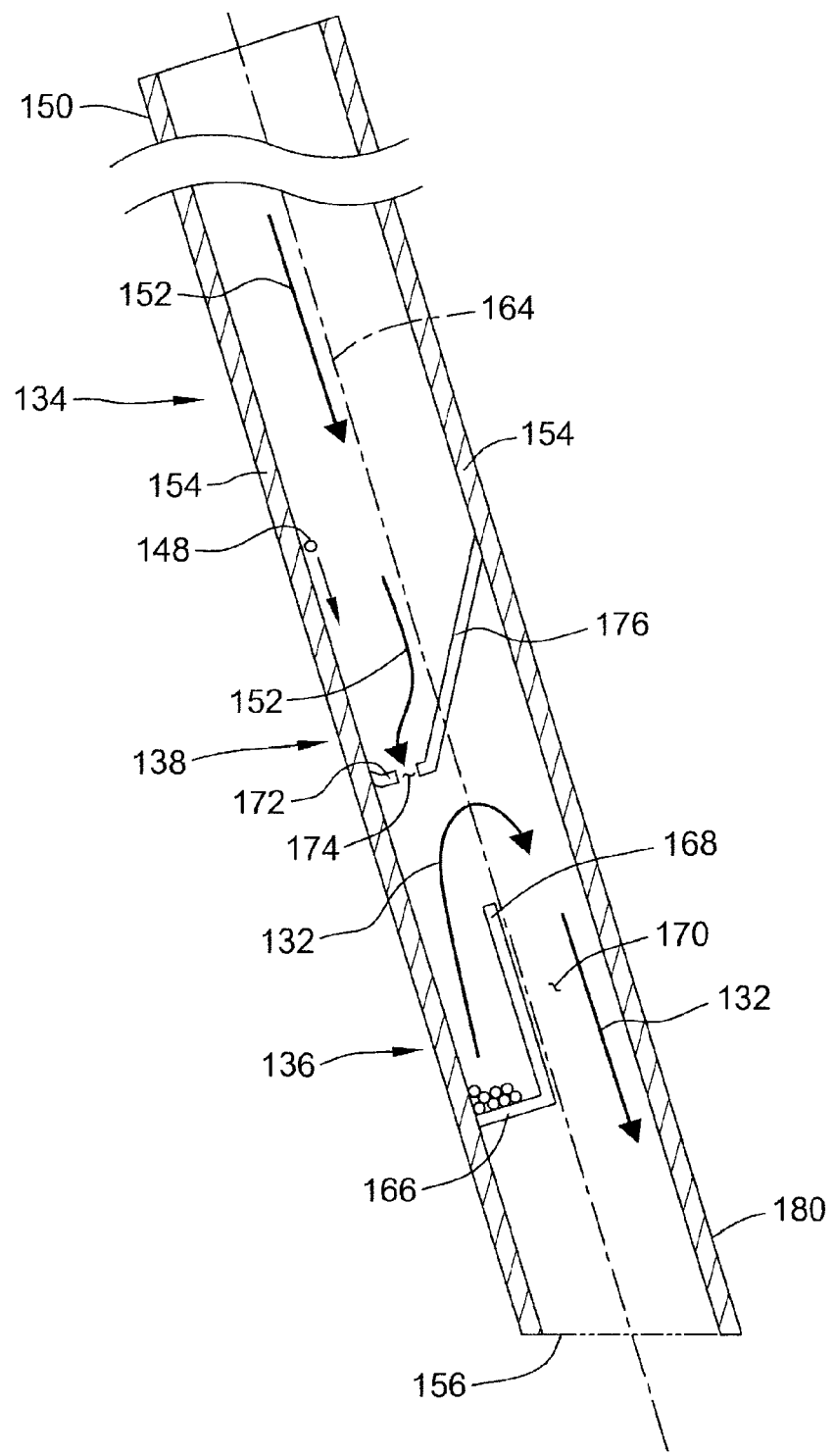
FIG. 2 is a cross-section of the gas doping system shown in FIG. 1 with various features omitted for illustration.

Referring now to FIG. 2, feeding tube 134 includes a feeding tube sidewall 154 having a first end 150 through which solid dopant 148 is introduced, and an opening 156 opposite first end 150 through which gaseous dopant 132 is introduced into furnace 108. In the embodiment shown in FIGS. 1 and 2, feeding tube 134 has a generally cylindrical shape defined by a single feeding tube sidewall 154 made of fused quartz. In other embodiments, feeding tube 134 may have any other suitable shape, and/or any number of feeding tube sidewalls that enable gas doping system 130 to function as described herein. In yet other embodiments, feeding tube 134 may be made of tungsten, molybdenum, or any other suitably unreactive refractory material (including metals and ceramics) that enables gas doping system 130 to function as described herein.

Feeding tube 134 is positioned within furnace 108, and extends through a valve assembly 158 and outside of furnace 108. In the embodiment shown in FIG. 1, feeding tube 134 is slidingly coupled to positioning system 142. Positioning system 142 is configured to raise and/or lower feeding tube 134. In the embodiment shown in FIG. 1, positioning system 142 includes a rail 160, a coupling member 162, and a motor (not shown) configured to move coupling member 162 along rail 160. Rail 160 extends in a direction substantially parallel to the longitudinal axis 164 of feeding tube 134. Coupling member 162 is slidingly coupled to rail 160, and affixed to feeding tube 134. Using positioning system 142, feeding tube 134 may be raised and lowered into and out of furnace 108. In other embodiments, feeding tube 134 may be positioned wholly within furnace 108, and/or may be permanently attached to furnace 108. In yet other embodiments, feeding tube 134 may be positioned within and/or secured within or outside furnace 108 in any manner that enables gas doping system 130 to function as described herein.

In the embodiment shown in FIGS. 1 and 2, feeding tube 134 is angled with respect to melt surface 146 to facilitate the distribution of gaseous dopant 132 across melt surface 146. In the embodiment shown in FIGS. 1 and 2, feeding tube 134 is angled such that the longitudinal axis 164 of feeding tube 134 forms an angle of between about 45 degrees and about 75 degrees with respect to the melt surface 146. Opening 156 may also be angled with respect to the longitudinal axis 164 of feeding tube 134 to facilitate the distribution of gaseous dopant 132 across melt surface 146. For example, in the embodiment shown in FIGS. 1 and 2, opening 156 is angled such that opening 156 is substantially parallel to melt surface 146, and angled at an angle of between about 45 degrees and about 75 degrees with respect to longitudinal axis 164 of feeding tube 134. In other embodiments, feeding tube 134 may be positioned substantially perpendicular to the melt surface 146 such that longitudinal axis 164 of feeding tube 134 forms an angle of about 90 degrees with respect to the melt surface 146. In yet other embodiments, feeding tube 134 and/or opening 156 may have any other suitable configuration or orientation that enables gas doping system 130 to function as described herein.

In this embodiment, feeding tube 134 is communicatively coupled to an inert gas supply 144 to reduce the back flow of gaseous dopant 132. An inert gas 152 may be introduced into feeding tube 134 from inert gas supply 144 at a given flow rate, such that inert gas 152 flows downwardly towards opening 156. As described in more detail below, fluid flow restrictor 138 reduces and/or eliminates the flow rate of inert gas 152 needed to prevent the back flow of gaseous dopant 132, and to supply gaseous dopant 132 to the melt surface 146. For example, inert gas flow rates of less than about 10 normal-liters per minute, less than about 5 normal-liters per minute, or even less than about 2 normal-liters per minute can be used with gas doping system 130 while maintaining a sufficient supply of gaseous dopant to melt surface 146. In the embodiment shown in FIGS. 1 and 2, the inert gas 152 is argon, although any other suitable inert gas may be used that enables the gas doping system 130 to function as described herein.

Feeding tube 134 of this embodiment is communicatively coupled to a dopant feeding device 140 configured to feed solid dopant 148 into feeding tube 134. In this embodiment, dopant feeding device 140 is automated, though in other embodiments it may be manually operated, or only partially automated. Feeding device 140 may be configured to automatically feed solid dopant 148 into feeding tube 134 based upon one or more user-defined parameters, and/or environment-specific parameters. For example, automated feeding device 140 may feed solid dopant 148 into feeding tube 134 based upon any one or more of the following parameters: preset time(s) during a growth process, user defined interval(s), the mass of solid dopant 148 within feeding tube 134 and/or evaporation receptacle 136, a concentration of gaseous dopant 132 within feeding tube 134, evaporation receptacle 136, and/or furnace 108, and a volumetric or mass flow rate of gaseous dopant 132 and/or inert gas 152. The continuous and/or intermittent feeding of solid dopant 148 to evaporation receptacle 136 enables a relatively constant gaseous dopant concentration to be maintained within furnace 108 during the crystal growth process, resulting in a more uniform dopant concentration profile in grown ingots.

Feeding device 140 of this embodiment is coupled to a controller 182 configured to control the frequency and/or amount of dopant 148 being fed into feeding tube 134 by feeding device 140. Controller 182 includes a processor 184 configured to send and receive signals to and from controller 182 and/or feeding device 140 based on one or more user-defined parameters and/or environment-specific parameters. In this embodiment, controller 182 includes a user interface 186 coupled to processor 182, and a sensor 188 coupled to processor 182. User interface 186 is configured to receive user-defined parameters, and communicate user-defined parameters to processor 184 and/or controller 182. Sensor 188 is configured to receive and/or measure environment-specific parameters, and communicate such environment-specific parameters to processor 184 and/or controller 182.

Evaporation receptacle 136 is positioned within feeding tube 134 near opening 156. Evaporation receptacle 136 is configured to vaporize dopant therein. Specifically, evaporation receptacle is configured to hold dopant 148 and transmit heat to dopant 148 such that dopant vaporizes within evaporation receptacle 136. In this embodiment, evaporation receptacle 136 may be positioned sufficiently near melt 104 such that radiant heat from melt 104 is sufficient to vaporize dopant 148 within evaporation receptacle 136. For example, evaporation receptacle 136 may be positioned between about 1 centimeter and about 15 centimeters above melt surface 146. In other embodiments, a separate heating element (not shown) may be used to supply heat to evaporation receptacle 136 to vaporize dopant 148 therein.

In the embodiment shown in FIGS. 1 and 2, evaporation receptacle 136 includes a base 166 extending laterally inward from feeding tube sidewall 154, and a receptacle sidewall 168 adjoining base 166 and extending upwardly from base 166 along the longitudinal axis 164 of feeding tube. In alternative embodiments, evaporation receptacle 136 may have any other suitable configuration that enables gas doping system 130 to function as described herein. In the embodiment shown in FIGS. 1-2, evaporation receptacle 136 and feeding tube 134 are made from a single piece of fused quartz. Integrating the evaporation receptacle within the feeding tube may provide a relatively simple construction of the gas doping system, and may reduce the overall size of the gas doping system. As a result, positioning the feeding tube and the evaporation receptacle within the furnace using a positioning system, such as positioning system 142, is made easier. In other embodiments, evaporation receptacle 136 may be made of any suitable material that enables gas doping system 130 to function as described herein. In yet other embodiments, evaporation receptacle 136 and feeding tube 134 may be fabricated as separate components.

A fluid flow channel 170 of this embodiment is partially defined by receptacle sidewall 168 and feeding tube sidewall 154. Fluid flow channel 170 provides fluid communication between evaporation receptacle 136 and opening 156 for gaseous dopant 132 being vaporized in evaporation receptacle 136. The cross-sectional area of fluid flow channel 170 perpendicular to the longitudinal axis 164 of feeding tube 134 may be adjusted in order to increase or decrease the flow rate of gaseous dopant 132 passing therethrough. For example, the cross-sectional area of fluid flow channel 170 may be decreased by extending the length of base 166. Similarly, the length of fluid flow channel 170 may be increased or decreased by varying the height of receptacle sidewall 168. By adjusting the cross-sectional area and or the length of fluid-flow channel 170, the flow rate of gaseous dopant 132 flowing out of feeding tube 134 may be optimized for maximum doping efficiency.

Fluid flow restrictor 138 is positioned within feeding tube 134 between first end 150 and evaporation receptacle 136. Fluid flow restrictor 138 is configured to permit the passage of solid dopant 148 therethrough, and also restrict the flow of gaseous dopant 132 therethrough. Fluid flow restrictor 138 therefore acts as a one-way valve for dopants supplied to furnace 108 via gas doping system 130.

In the embodiment shown in FIGS. 1 and 2, fluid flow restrictor 138 includes a bottom 172 having a second opening 174 therethrough, and a conical sidewall 176. Conical sidewall extends inwardly from feeding tube sidewall 154, and downwardly towards bottom 172. The fluid-dynamic properties of fluid-flow restrictor 138 reduce or prevent back flow of gaseous dopant 132 through second opening 174, while also permitting solid dopant 148 to pass therethrough. In the embodiment shown in FIGS. 1 and 2, conical sidewall 176 funnels solid dopant 148 through second opening 174, and into evaporation receptacle 136. As dopant 148 is vaporized in evaporation receptacle 136, conical sidewall 176 diverts gaseous dopant 132 flowing upwards away from second opening 174, thereby limiting back flow of gaseous dopant 132. Additionally, conical sidewall 176 directs inert gas 152 through second opening 174 (which has a smaller cross-section than feeding tube 134), creating a localized high pressure area of inert gas 152 near second opening 174, thereby restricting back flow of gaseous dopant 132 therethough. Fluid flow restrictor 138 thus reduces, or eliminates, the need to flow inert gas through feeding tube in order to prevent back flow of gaseous dopant, and/or to supply gaseous dopant to the melt surface. As a result, the negative effects associated with the use of inert gas flow in gas doping systems, namely, dilution of gaseous dopant concentration and gaseous dopant being purged too rapidly from the furnace, are also reduced.

As described above, in the embodiments shown in FIGS. 1 and 2, fluid flow restrictor 138 includes a bottom 172 having a second opening 174 therethrough, and a conical sidewall 176 extending inwardly from feeding tube sidewall 154. In alternative embodiments, fluid flow restrictor 138 may have any suitable configuration that enables gas dopant system 130 to function as described herein. In the embodiment shown in FIGS. 1 and 2, fluid flow restrictor 138 and feeding tube 134 are made of a single piece of fused quartz. In other words, fluid flow restrictor 138 and feeding tube 134 are of a one-piece construction. Integrating the fluid flow restrictor within the feeding tube may reduce the overall size of the gas doping system. This may facilitate positioning the feeding tube and the fluid flow restrictor within the furnace using a positioning system, such as positioning system 142. In other embodiments, fluid flow restrictor and feeding tube may be made separately, and may be made of any suitable material that enables gas doping system 130 to function as described herein.

Figure 3:
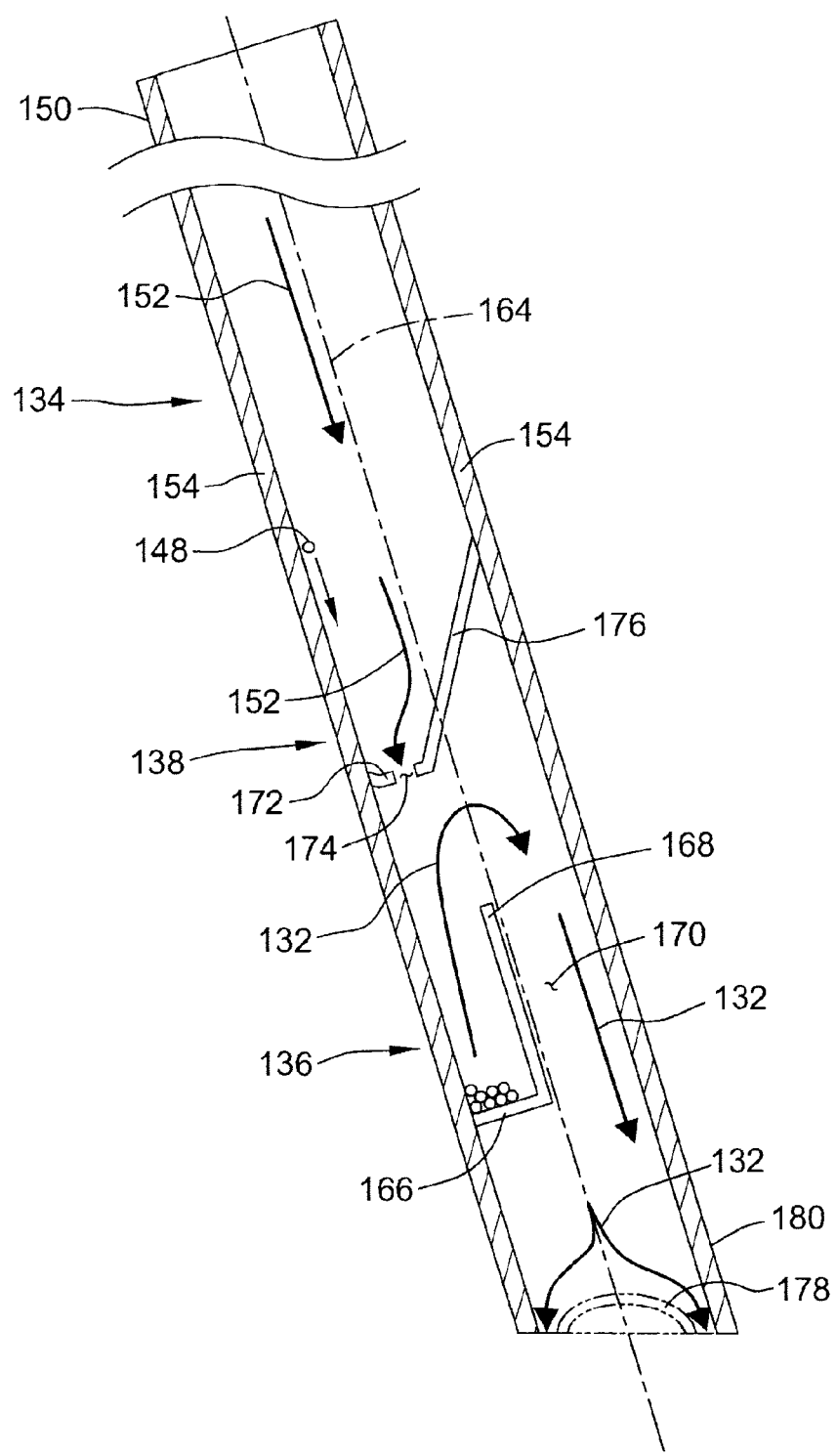
FIG. 3 is a cross-section of an alternative gas doping system with various features omitted for illustration.

Referring now to FIG. 3, gas doping system 130 includes a fluid-distribution plate 178 configured to distribute gaseous dopant 132 across melt surface 146. In the embodiment shown in FIG. 3, fluid-distribution plate 178 is coupled to feeding tube 134 at a second end 180 distal from first end 150. In the embodiment shown in FIG. 3, fluid-distribution plate has a hemi-spherical shape. In alternative embodiments, fluid-distribution plate may have a conical, rectangular, or square shape, or any other suitable shape that enables gas doping system 130 to function as described herein.

As described above, gas doping systems of the present disclosure provide an improvement over known doping systems. The gas doping system increases doping efficiency by reducing the need for inert gas flow to prevent back flow of gaseous dopant and to supply gaseous dopant to the melt surface. By reducing the need of inert gas flow, the gas doping system reduces the negative effects associated with the use of inert gas flow in gas doping systems, namely, dilution of gaseous dopant concentration and gaseous dopant being purged too rapidly from the furnace. Gas doping systems of this disclosure may increase doping efficiency by enabling a continuous or intermittent supply of solid dopant to the evaporation receptacle during the crystal growth process. By continuously or intermittently supplying solid dopant to the evaporation receptacle, a relatively constant gaseous dopant concentration can be maintained within the furnace during the crystal growth process. Gas doping systems of this disclosure may increase doping efficiency by providing an angled feeding tube, an angled opening and/or a fluid-distribution plate at the feeding tube end where gaseous dopant exits feeding tube. By providing an angled feeding tube, an angled opening, and/or a fluid-distribution plate, the distribution of gaseous dopant across the melt surface may be optimized to permit maximum doping of the melt for a given amount of dopant. For example, systems of this disclosure may enable growth of highly doped crystals with arsenic or phosphorous concentrations as high as $10^{19}$ to $10^{20}$ atoms/cm$^3$.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

The invention claimed is:

1. A method for doping a melt of semiconductor or solar-grade material, the method comprising:
   introducing a solid dopant through a first end of a feeding tube of a crystal pulling apparatus, the feeding tube being partially disposed within a furnace that includes a crucible that holds a melt of semiconductor or solar-grade material, the first end of the feeding tube being external to the furnace with dopant continuously or intermittently being introduced through the first end and falling down the feeding tube and into the furnace, the dopant falling through a second opening formed in a bottom of a fluid flow restrictor and into an evaporation receptacle, the fluid flow restrictor and evaporation receptacle being disposed within the feeding tube, the dopant contacting a conically-shaped portion of the fluid flow restrictor as the dopants falls through the feeding tube and being directed to the second opening by the conically-shaped portion of the fluid flow restrictor;
   vaporizing the dopant within the evaporation receptacle to form a gaseous dopant, the gaseous dopant being restricted from moving upward through the feeding tube toward the first end of the fluid flow restrictor; and
   flowing an inert gas through the feeding tube at a flow rate of less than about 10 normal-liters per minute, the inert gas flowing through the second opening of the fluid flow restrictor, the inert gas carrying gaseous dopant toward a feeding tube opening, the gaseous dopant and the inert gas being introduced into the furnace through the feeding tube opening.

2. The method according to claim 1, wherein the flow rate of the inert gas is less than about 2 normal-liters per minute.

3. The method according to claim 1, wherein the evaporation receptacle comprises a base extending inwardly from at least one feeding tube sidewall and a receptacle sidewall adjoining the base and extending upwardly from the base.

4. The method according to claim 3, wherein the gas doping system further comprises a fluid flow channel at least partially defined by the receptacle sidewall and the at least one feeding tube sidewall.

5. The method according to claim 1 comprising feeding the solid dopant into the feeding tube.

6. The method according to claim 1 comprising automatically feeding the solid dopant into the feeding tube.

7. The method according to claim 1, wherein the gas doping system further comprises a fluid-distribution plate coupled to the feeding tube at a second end distal from the first end.

8. The method according to claim 1 comprising raising and lowering the feeding tube.

9. The method according to claim 1, wherein the opening of the feeding tube is angled at an angle of between about 45 degrees and about 75 degrees with respect to a longitudinal axis of the feeding tube.

10. The method according to claim 1, wherein the feeding tube is angled at an angle of between about 45 degrees and about 75 degrees with respect to a surface of the melt.

11. The method according to claim 1, wherein the evaporation receptacle is positioned sufficiently near the melt such that radiant heat from the melt is sufficient to vaporize the dopant within the evaporation receptacle.

12. The method according to claim 1, wherein the evaporation receptacle is positioned between about 1 centimeter and about 15 centimeters above a surface of the melt.

13. The method according to claim 1, wherein the feeding tube is communicatively coupled to an inert gas supply.

14. The method according to claim 1 comprising forming a crystal from the melt, the crystal having a dopant concentration between about $10^{19}$ and $10^{20}$ atoms of dopant per $cm^3$.

15. The method according to claim 14, wherein the dopant is arsenic or phosphorus.

\* \* \* \* \*